(12) United States Patent
Dishongh et al.

(10) Patent No.: US 6,803,527 B2
(45) Date of Patent: Oct. 12, 2004

(54) CIRCUIT BOARD WITH VIA THROUGH SURFACE MOUNT DEVICE CONTACT

(75) Inventors: Terrance J. Dishongh, Hillsboro, OR (US); Bryce Horine, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 8 days.

(21) Appl. No.: 10/108,127

(22) Filed: Mar. 26, 2002

(65) Prior Publication Data

US 2003/0183420 A1 Oct. 2, 2003

(51) Int. Cl.⁷ ................................................ H05K 1/16
(52) U.S. Cl. ........................ 174/260; 174/262; 29/832; 29/842
(58) Field of Search .................... 174/260, 262–266; 361/782, 783, 808, 832, 838, 842

(56) References Cited

U.S. PATENT DOCUMENTS

| | | | | |
|---|---|---|---|---|
| 3,052,957 A | * | 9/1962 | Swanson | 29/847 |
| 4,631,100 A | * | 12/1986 | Pellegrino | 156/150 |
| 5,088,007 A | * | 2/1992 | Missele | 361/704 |
| 5,491,303 A | * | 2/1996 | Weiss | 174/262 |
| 5,886,876 A | * | 3/1999 | Yamaguchi | 361/767 |
| 6,222,738 B1 | * | 4/2001 | Maeno et al. | 361/772 |
| 6,288,906 B1 | * | 9/2001 | Sprietsma et al. | 361/772 |
| 6,346,679 B1 | * | 2/2002 | Nakamura | 174/260 |
| 6,356,453 B1 | * | 3/2002 | Juskey et al. | 361/760 |
| 6,403,893 B2 | * | 6/2002 | Achari et al. | 174/255 |
| 6,509,530 B2 | * | 1/2003 | Pearson et al. | 174/260 |

* cited by examiner

*Primary Examiner*—Evan Pert
*Assistant Examiner*—Jeremy Norris
(74) *Attorney, Agent, or Firm*—Blakely, Sokoloff, Taylor & Zafman LLP

(57) ABSTRACT

A circuit board apparatus and a method for a circuit board. An embodiment of a circuit board includes a first layer and a second layer; a substrate between the first layer and the second layer; a first surface mount device pad on the first layer of the substrate; a first via, the first via being formed partially or wholly through a first end of the first surface mount device pad, the first via passing through the substrate between the first layer and the second layer; a second surface mount device pad adjacent to the first surface mount device pad; and a second via, the second via being formed partially or wholly through a first end of the second surface mount device pad, the second via passing through the substrate, the first end of the first surface mount device pad being the end of the first surface mount device pad that is the farthest from the first end of the second surface mount device pad.

14 Claims, 8 Drawing Sheets

Embodiment of Vias
in Surface Mount Pads

Embodiments of Vias
Formed Partially
Through Surface Mount Pads

Figure 1

Prior Art
Conventional Via - Top view

Prior Art
Conventional Via – Side view

Figure 2

Figure 3 — Embodiment of Vias in Surface Mount Pads

Figure 4 — Embodiment of Vias in Surface Mount Pads

Figure 5

Embodiments of Vias Formed Partially Through Surface Mount Pads

Embodiment of Toe Via - Side View

Figure 6

Embodiment of Heel Via - Side View

Fabrication of Circuit Board With Vias Through Pads For Surface Mount Devices

CIRCUIT BOARD WITH VIA THROUGH SURFACE MOUNT DEVICE CONTACT

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software and data as described below and in the drawings hereto: Copyright© 2002, Intel Corporation, All Rights Reserved.

FIELD OF THE INVENTION

This invention relates to circuit boards in general, and more specifically to a circuit board with a via through a contact used for the installation of a surface mount device.

BACKGROUND OF THE INVENTION

In the fabrication of printed circuit boards, multiple layers of connections may be created. In addition to other types of components used in circuit boards, certain components known as surface mount devices are mounted on the surface of circuits boards, with the mounting of a surface mount device generally being performed by soldering the leads or pins of the device to conductive pads or contacts on the surface of the circuit board. This is contrasted with, for example, components known as through hole devices with leads that are fed through holes in a circuit board, the leads then being connected to the opposite side of the circuit board.

The leads of a surface mount device may be electrically connected to other board layers by vias that are formed through the circuit board. In conventional construction, the pads for the installation of a surface mount device are connected by a trace that runs between the pad and the location for the via. Any signal or current must be transferred from the device lead through the pad, through the trace, and then through the via to the connecting layer of the circuit board.

Figure 1:
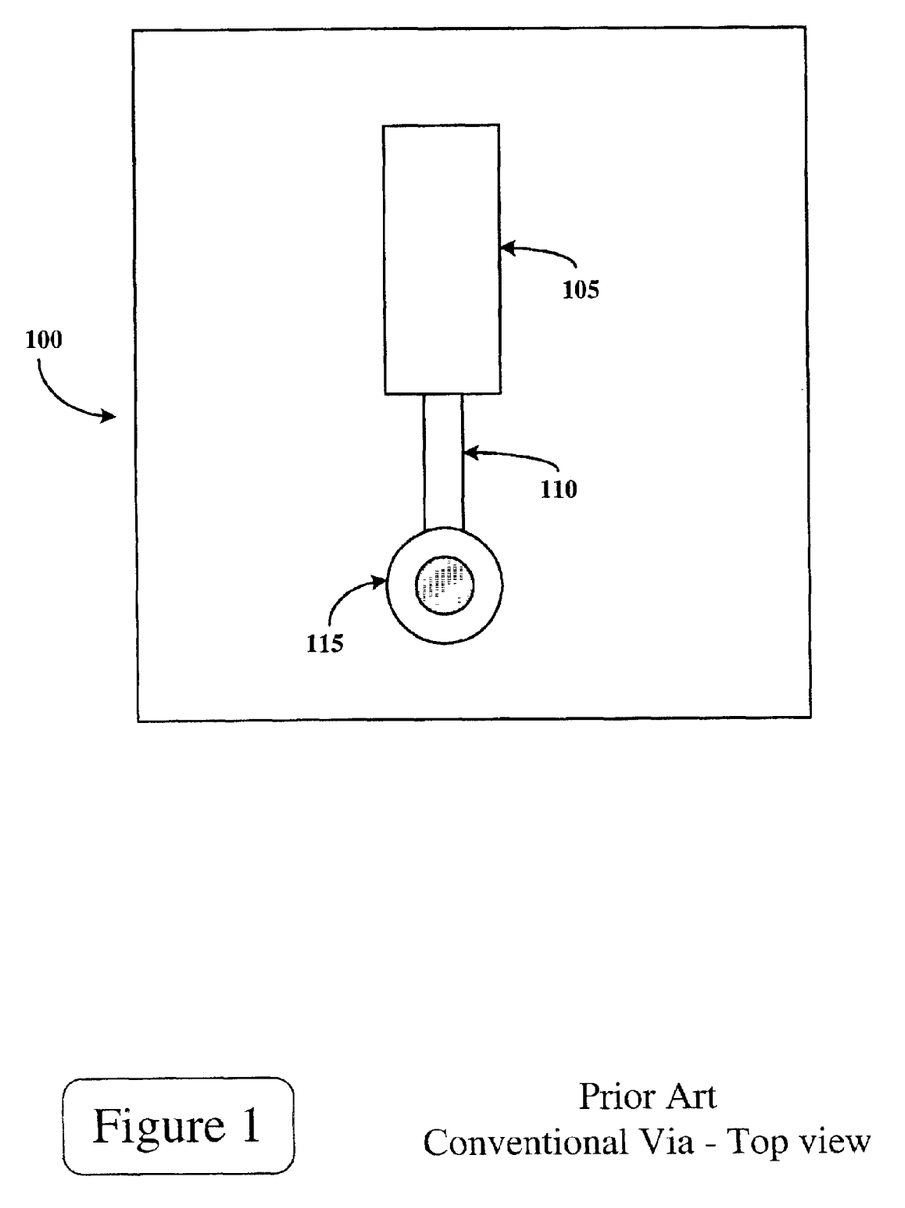
FIG. 1 illustrates a circuit board containing a conventional via as shown from a top view.

An example of conventional construction of a circuit board is shown in FIG. 1. In FIG. 1, the circuit board 100 may contain a number of pads for the installation of one or more surface mount devices. One of the pads 105 for installation of a surface mount device is shown. Connected to the pad 105 is a trace 110 to a via 115, the via being a plated through hole created in the circuit board 100. The via 115 provides an electrically conductive path from the lead of the surface mount device to one or more other layers of the circuit board 100.

Figure 2:
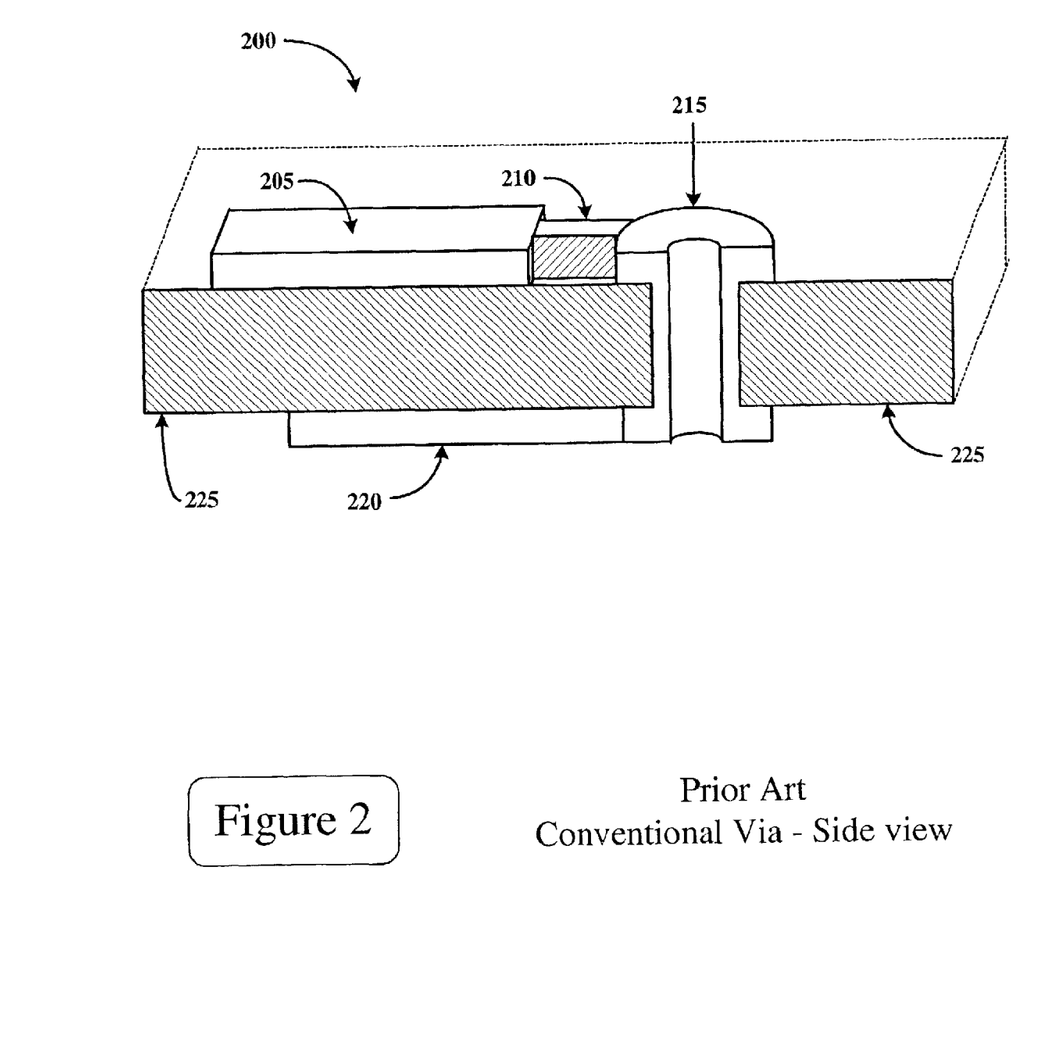
FIG. 2 illustrates a circuit board containing a conventional via as shown from a side view.

Another view of conventional construction of a circuit board is shown in FIG. 2. Please note that the dimensions of the elements shown in this figure and the other figures in this application are not necessarily drawn to scale. The figures are intended to illustrate the relationship of the elements. In particular, the thickness of the pads and traces on the circuit boards has been increased in order to provide a more clear view of the elements. In this side view, a circuit board 200 contains a number of pads for installation of one or more surface mount devices. One surface mount device pad 205 is shown in FIG. 2 on the circuit board substrate 225. Connected to the surface mount device pad 205 is a trace 210 that provides an electrical path to via 215, which is a plated through hole in circuit board 200. The via 215 is formed through the circuit board substrate 225 to produce an electrical path to one or more layers of the circuit board 200. In the conventional example shown in FIG. 2, the pad 205 is connected through trace 210 and via 215 to a connection 220. Connection 220 could be a power connection, a ground plane, or other connection to a surface mount device.

A circuit board including conventional via construction, such as that shown in FIGS. 1 and 2, suffers from certain disadvantages. The use of a trace from a surface mount device pad to the location of a via increases the length of travel of a signal or current, and thereby increases the inductance created by the electrical path loop. The increased inductance has implications in the operation of the circuit board at high speeds, with inductance having particular implications in differential signaling applications. Similarly, the longer loop increases the resistance in the electrical path, also affecting circuit board operation. Further, placement of the trace and the via on the circuit board reduces the amount of space available for other devices or connections on the board, thereby having an impact on the design of a printed circuit board and cost of board fabrication.

BRIEF DESCRIPTION OF THE DRAWINGS

The appended claims set forth the features of the invention with particularity. The invention, together with its advantages, may be best understood from the following detailed descriptions taken in conjunction with the accompanying drawings, of which:

DETAILED DESCRIPTION

A method and apparatus are described for a circuit board with a via through a surface mount device pad. In an embodiment, a circuit board includes one or more vias that are formed wholly or partially through pads used for the installation of surface mount devices, eliminating the need for placement of traces to vias located outside the pads.

In the following description, for the purposes of explanation, numerous specific details are set forth in order to provide a thorough understanding of the present invention. However, it will be apparent to one skilled in the art that the present invention may be practiced without some of these specific details. In other instances, well-known structures and devices are shown in block diagram form.

The present invention includes various processes, which will be described below. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Terminology

Before describing an exemplary environment in which various embodiments of the present invention may be implemented, some terms that will be used throughout this application will briefly be defined:

As used herein, "via" means a plated through hole in a circuit board used to route a connection or trace from one layer to another in the board. A via may be formed by drilling, by laser, or by any other appropriate fabrication method.

As used herein, "surface mount device" means an electronic component that is installed on the surface of a circuit board. The pins or leads of a surface mount device are generally soldered to the surface of a circuit board and are not fed into holes through the surface of the circuit board. A surface mount device is contrasted with a through hole device, in which generally the pins or leads of a component are fed through holes in a circuit board and are soldered to contacts on the opposite side of the board.

As used herein, "pad" means a conductive surface or contact for the installation of a lead of a surface mount device.

As used herein, "trace" means a conductive path on a layer of a printed circuit board for carrying signals or other current flow from one point to another point.

Under an embodiment, a via is formed in a circuit board wholly or partially through a pad for a surface mount device. By forming the via through the pad instead of creating a via off the pad that is connected by a trace, the length of the loop for a signal is reduced, thereby reducing both the inductance created by the loop and the resistance associated with the path for the signal. Further, the placement of the via in the pad saves space on the circuit board that would otherwise be used for an off-pad placement of the via.

As mentioned above in the background of the invention, the elements in the figures provided herein are not necessarily drawn to scale, but are rather intended to differentiate between the various elements and regions in the figures. In particular, the thickness of certain layers have been increased in size in relation to other dimensions in order to allow clear depiction of the elements of each example.

Figure 3:
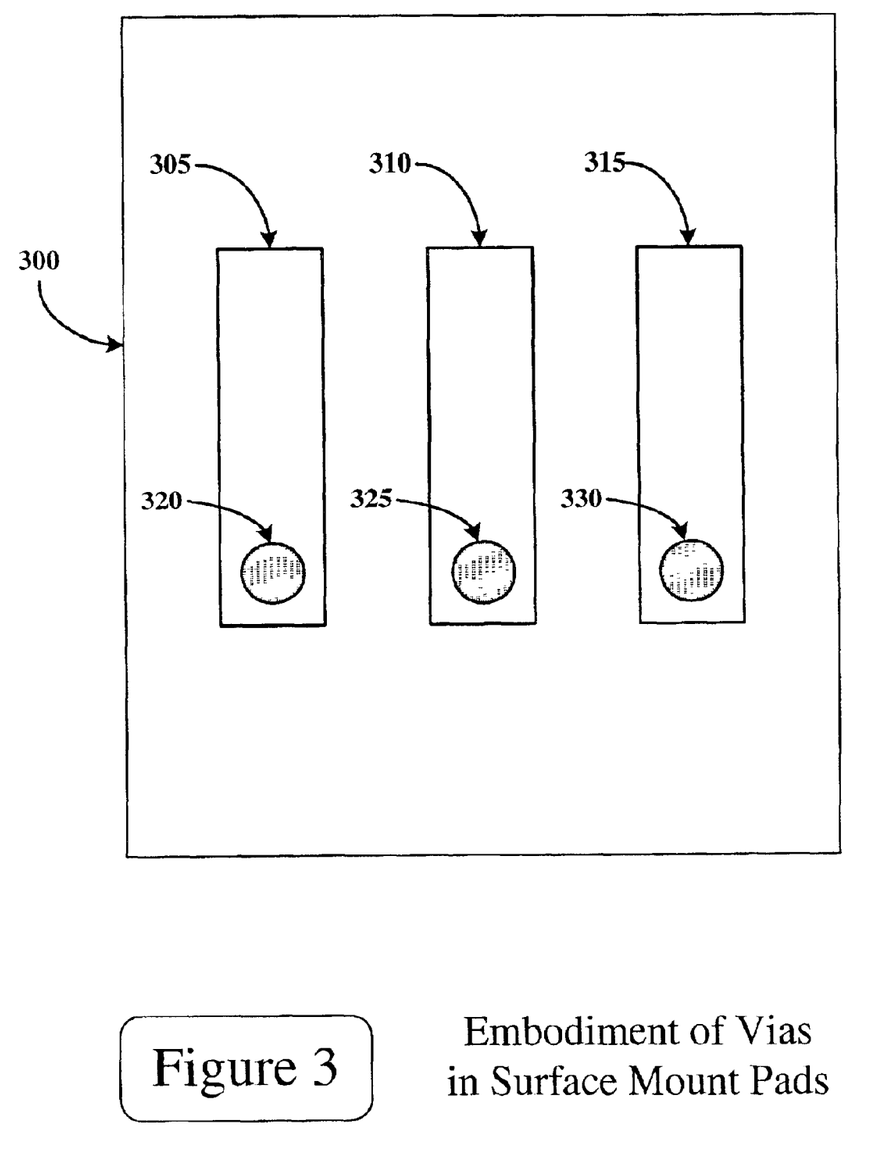
FIG. 3 illustrates an embodiment of a circuit board with vias formed through surface mount device pads, as shown from a top view.

FIG. 3 depicts a top view of an embodiment of vias formed through surface mount device pads. In this embodiment, circuit board 300 may be a motherboard or other type of printed circuit board. Circuit board 300 contains a number of pads for the mounting of one or more surface mount devices. Three pads 305, 310, and 315 are shown placed in parallel. In this example, vias 320, 325, and 330 are formed in the same end of each pad. In this manner, the vias are formed without requiring off-pad via locations, and therefore without requiring the placement of traces between the pads and the vias. Note that the actual shape of the surface mount device pads may vary depending on the device to be installed and other considerations. In this particular embodiment, the vias are formed wholly within the pads, but this is not necessary in every embodiment. Further, FIG. 3 and the other figures herein illustrate pads that each include a single via, but it is possible to place more than one via through a pad if this provides an advantage in the design of a circuit board.

A surface mount device will commonly have a plurality of leads and the pads for attachment of the leads to the surface of a circuit board may be arranged in parallel. If there is sufficient space between the pads and the pads themselves are of sufficient width, the vias may be formed through the same end of each pad. However, in surface mount devices with very fine pitch, the pads may be narrow and physically located very close together. The closely spaced pads may result in construction difficulties and board strength issues if the vias are formed through the same end of each pad because of close proximity of the holes to each other. In a particular embodiment, the vias are formed through alternate ends of adjacent surface mount device pads. A via formed in the end of a pad that is nearest the end of a device lead may be referred to as a "toe via". A via formed in the end of a pad that is nearest the body of the device may be referred to as a "heel via". Using this terminology, under a particular embodiment, toe vias are alternated with heel vias. The alternation of toe vias and heel vias has the advantage of physically separating the vias from each other when surface mount devices with fine pitch are installed on a circuit board, increasing physical board strength and reducing the risk of problems such as adjacent vias shorting together. Other patterns of vias may be used depending on the design of the circuit board.

Figure 4:
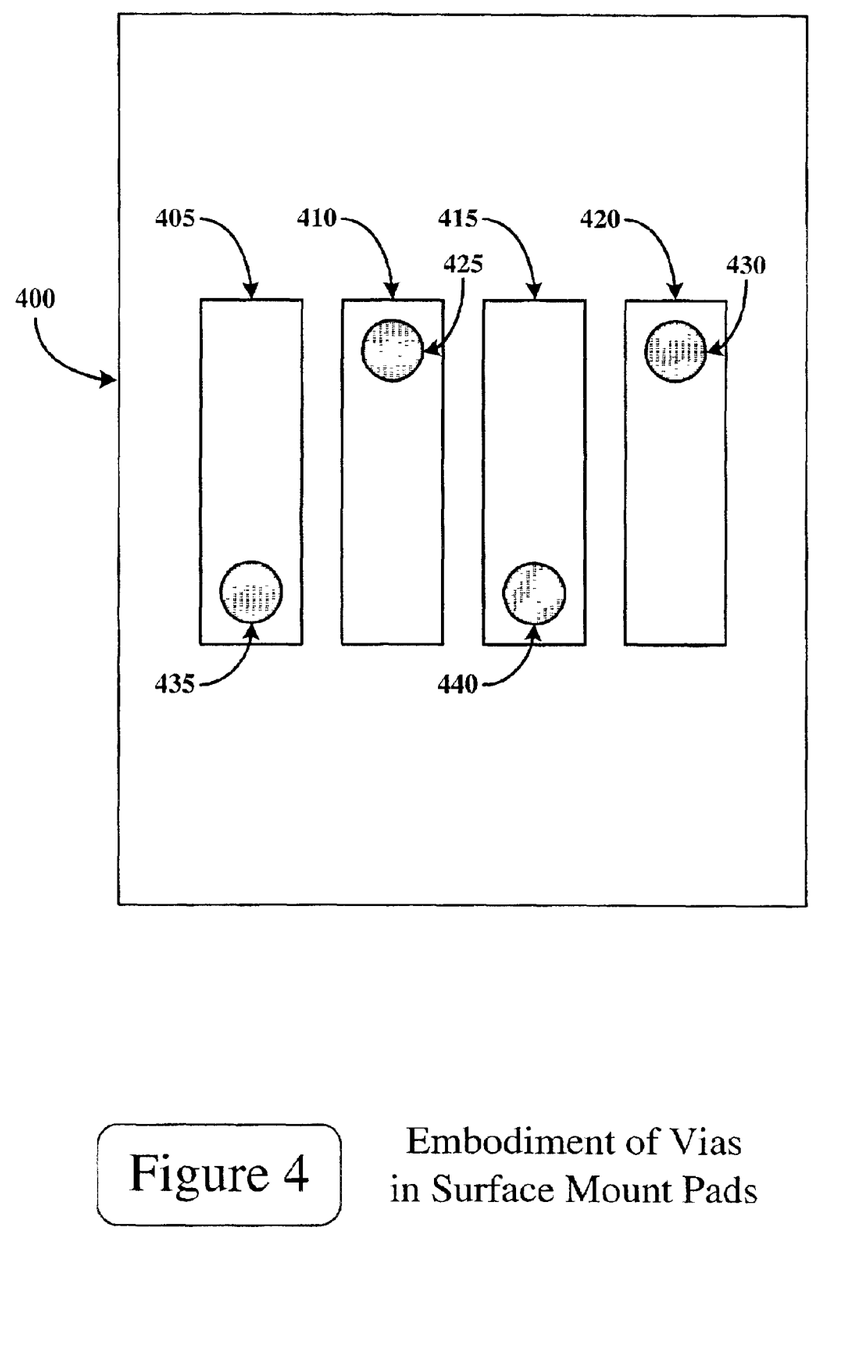
FIG. 4 illustrates an embodiment of alternating toe vias and heel vias in a circuit board, as shown from a top view.

FIG. 4 depicts a particular embodiment of vias formed through surface mount device pads. In this embodiment, circuit board 400 has a plurality of pads for installation of one or more surface mount devices. In this depiction, pads 405, 410, 415, and 420 are arranged in close proximity, as when a device has leads with fine pitch. In this embodiment, the vias in the pads are designed to be arranged in an alternating fashion between toe vias and heel vias. If in this embodiment vias 425 and 430 are toe vias and vias 435 and 440 are heel vias. While FIG. 4 depicts each of the surface device pads having vias, this is not necessary in all embodiments. For example, vias may be formed in certain of the surface mount device pads while other pads may be connected by traces to other points on the same layer of the circuit board or may be connected to vias that are located off the mounting pads. FIG. 4 illustrates an embodiment in which the vias are formed wholly through the pads, but this may vary in other embodiments. One or more of the vias may be formed partially through a surface mount device pad.

Figure 5:
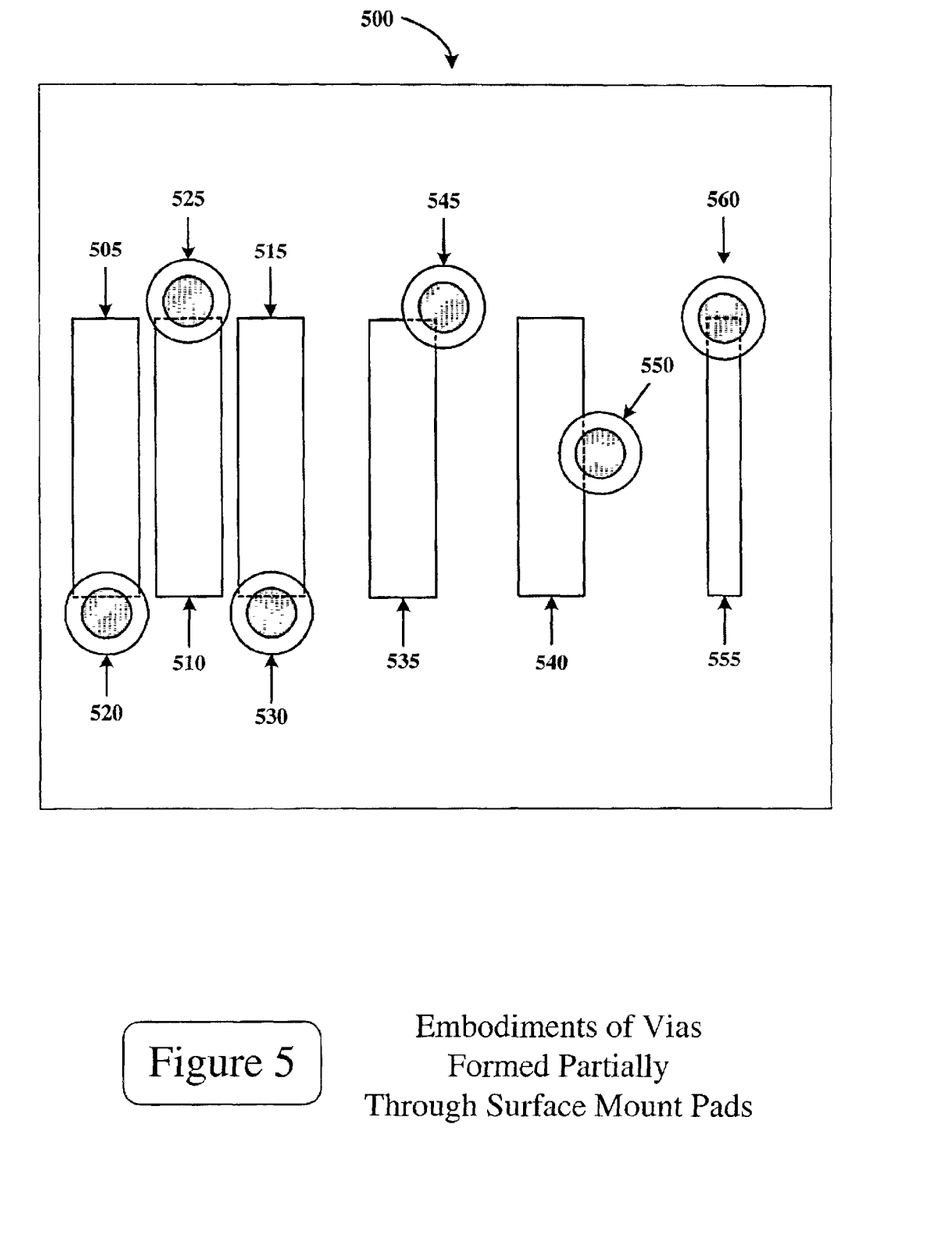
FIG. 5 illustrates embodiments of vias placed partially through surface mount device pads.

In other embodiments, the placement of vias through surface mount device pads may be varied. In certain instances, the placement of a via wholly through a surface mount device pad may be impractical. FIG. 5 illustrates examples of embodiments of vias partially through surface mount device pads. Within a circuit board 500 surface mount device pads 505, 510, and 515 illustrate pads with a fine enough pitch that the placement of vias wholly within a pad may interfere with or cause an electrical short with adjacent pads. In this embodiment, vias 520, 525, and 530 have been designed to be partially within surface mount device pads 505, 510, and 515, respectively. In this example, the surface pads are too narrow and closely spaced to allow for placement of vias wholly through the pads. While this example shows a via partially through each of surface mount device pads 505, 510, and 515, this is not necessary in all embodiments.

In certain embodiments, it may be advantageous to place a via in a different location than those shown for surface mount device pads 505, 510, and 515. For example, the design of a printed circuit board may be such that the placement of a via partially through one of the ends of a surface mount device pad could create difficulties with other areas of the circuit board. Surface mount device pads 535 and 540 in FIG. 5 illustrate two possible embodiments. Via 545 is placed such that it is partially through a corner of surface mount device pad 535, which may assist in some circuit board designs. Similarly, via 550 is placed through a side of surface mount device pad 540. Surface mount device pad 555 illustrates a particular embodiment in which the pad is sufficiently narrow that it is not physically possible to place a via wholly through the pad. In such an embodiment, the via may be placed partially through the pad, such as the placement of via 560.

Figure 6:
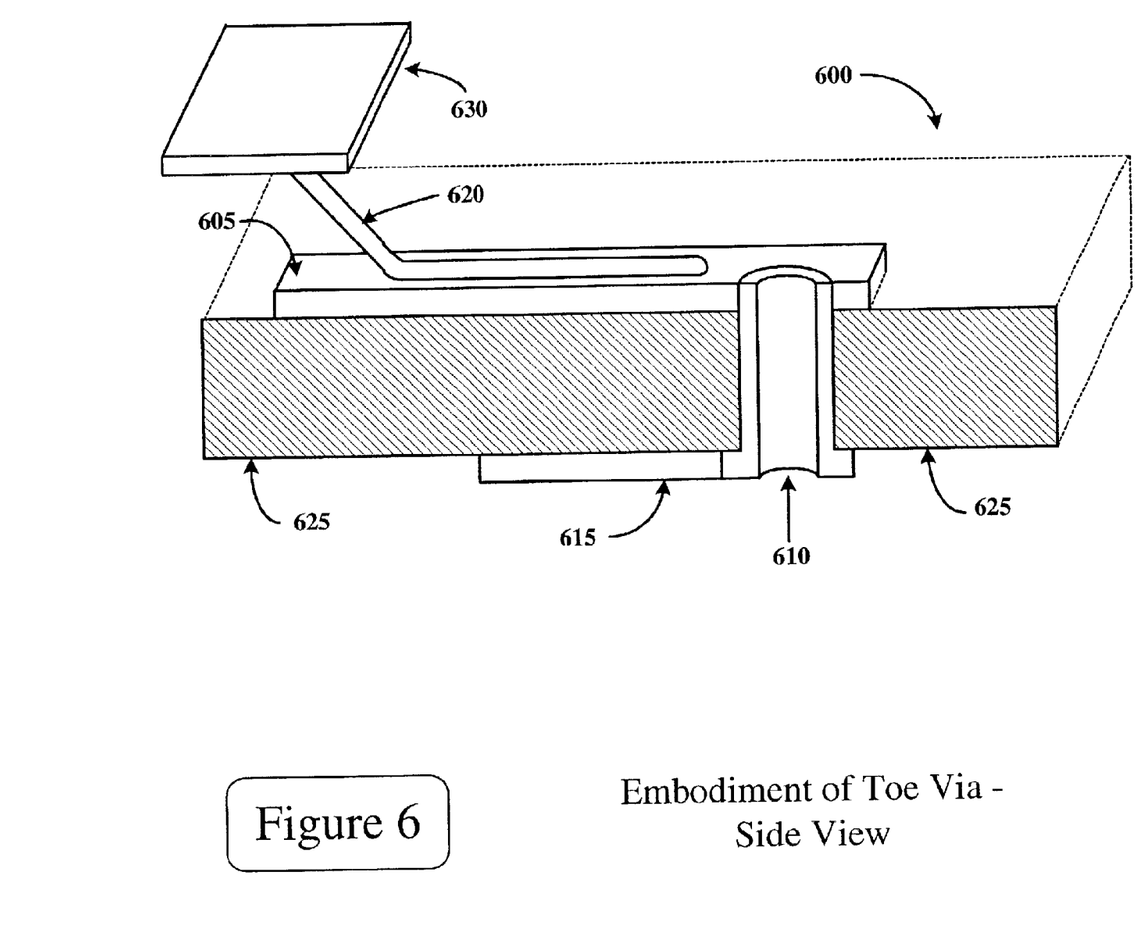
FIG. 6 illustrates an embodiment of a toe via from a side view.

FIG. 6 is an illustration of a side view of a toe via. In the embodiment shown in FIG. 6, a circuit board 600 may contain a plurality of pads for the installation of one or more surface mount devices. Via 610 is designed to be formed through one end of pad 605 and through circuit board substrate 625. In this example, via 610 connects the pad 605 to a contact 615 on the opposite side of circuit board substrate 625. For simplicity in this particular depiction, the circuit board 600 is shown with only a top layer and a bottom layer, but the circuit board may include additional layers in between these layers. In FIG. 6, a lead 620 of a surface mount device 630 is mounted to pad 605 and the via 610 is formed in the end of the pad 605 that is closer to the end of the lead 620 and thus via 610 is a toe via.

Figure 7:
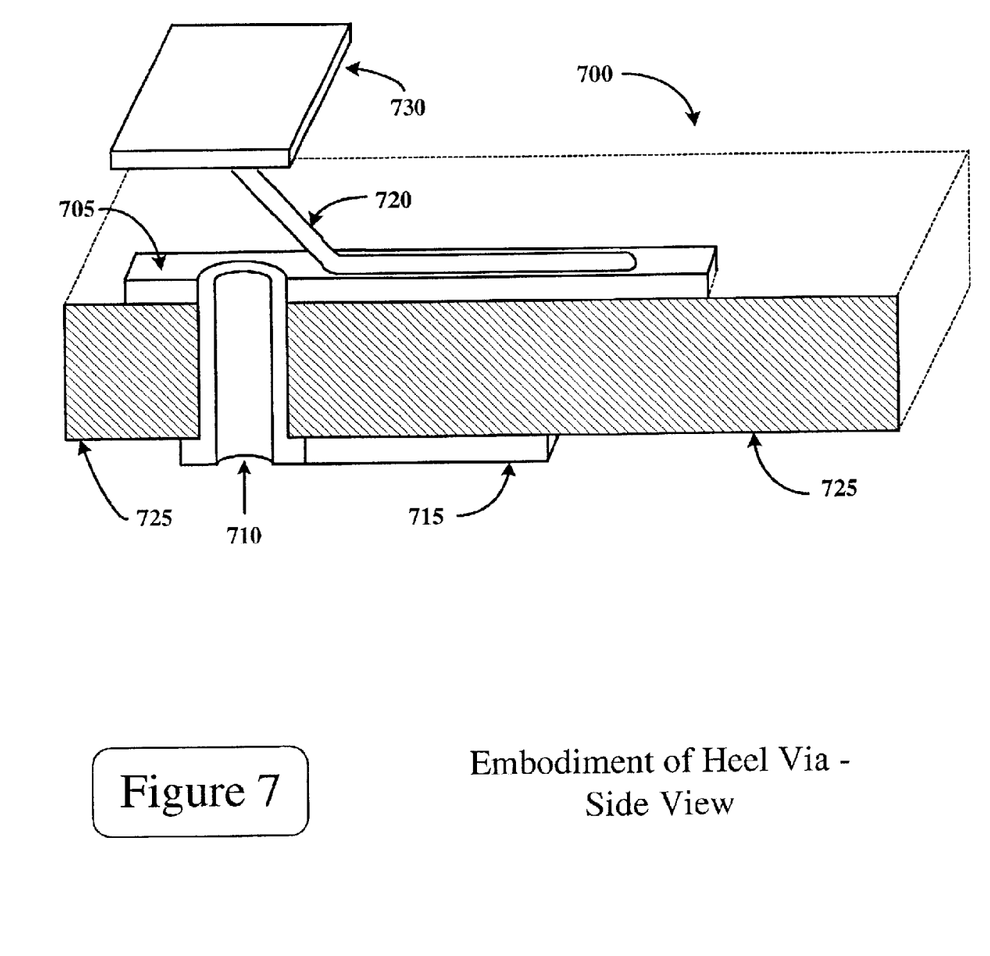
FIG. 7 illustrates an embodiment of a heel via from a side view.

FIG. 7 is an illustration of a side view of a heel via. In the embodiment shown in FIG. 7, a circuit board 700 may contain a plurality of pads for the installation of one or more surface mount devices. Via 710 is formed through one end of pad 705 and through circuit board substrate 725. In this example, via 710 connects the pad 705 to a contact 715 on the opposite side of circuit board substrate 725. For simplicity in this particular depiction, the circuit board 700 is again shown with a top layer and a bottom layer, but the circuit board may include additional layers in between these layers. In FIG. 7, a lead 720 of a surface mount device 730 is mounted to pad 705 and the via 710 is formed in the end of the pad 705 that is closer to the body of the surface mount device of which lead 720 is a part. Therefore, in this embodiment via 710 is depicted as a heel via. FIGS. 6 and 7 illustrate embodiments of vias that are formed wholly through surface mount device pads, but in other embodiments the vias may be formed partially through the surface mount device pads. Note that for simplicity of illustration surface mount device 630 in FIG. 6 and surface mount device 730 in FIG. 7 are each shown with a single lead, but generally the devices will have numerous leads.

In some embodiments, a via through a surface mount device pad, such as via 610 shown in FIG. 6 or via 710 shown in FIG. 7, may be at least partially filled with an electrically conductive or nonconductive material. In a certain embodiment, a via may be capped from the bottom side (the side opposite the side containing the surface mount device) with a solder mask to a specified fill of the volume of the via.

Figure 8:
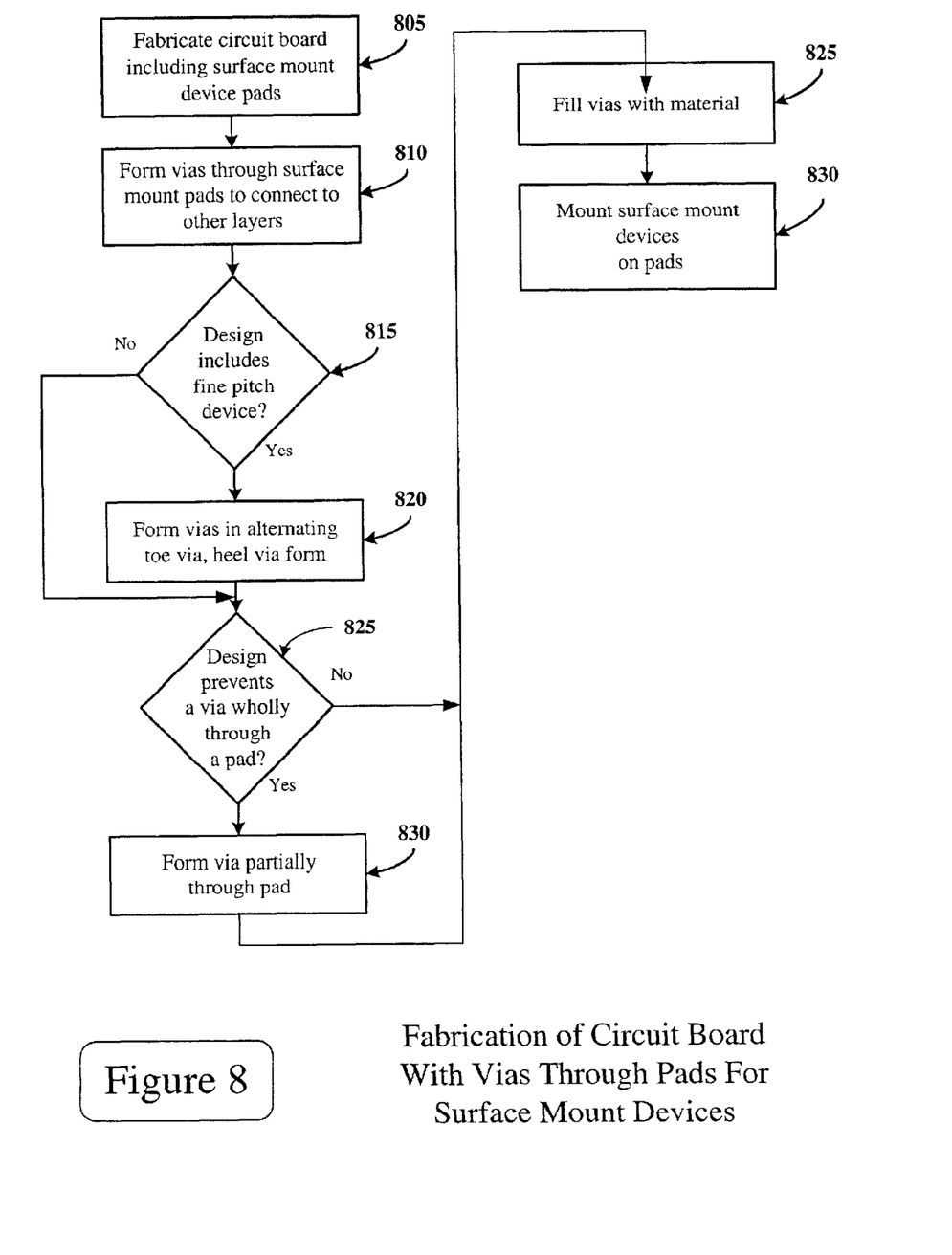
FIG. 8 contains a flow chart illustrating processes for producing a circuit board with vias formed through surface mount device pads.

FIG. 8 contains a flowchart of an embodiment of a method for producing a printed circuit board that has been designed to include at least one via formed wholly or partially through a pad for installation of a surface mount device. Note that numerous processes in the design and manufacture of printed circuit boards that are generally known have been excluded from FIG. 8. Although there are numerous variations in printed circuit board fabrication methods, such processes may include, without limitation, cleaning of the substrate, application of photoresist film, masking the photoresist film, exposing the photoresist film, developing the photoresist film, etching, and stripping the photoresist film. In multi-layer boards, additional processes connected with the lamination of boards to form the completed board may also be included.

In the embodiment shown in FIG. 8, a circuit board is fabricated, with the design of the circuit board including pads for the installation of surface mount devices, process block 805. According to the design of the board, a via is formed through each of one or more of the pads to connect the pads to certain layers of the circuit board, process block 810. If the design of the circuit board includes the installation of a fine pitch device, process block 815, then vias may be formed as alternating toe vias and heel vias, process block 820. The placement of vias in the circuit board design may also be influenced by other factors, especially in high-density printed circuit boards that includes many devices, traces, and vias in close proximity. If the circuit board includes factors preventing the placement of vias wholly through a surface mount device pad, process block 825, the design of the board may include the placement of one or more vias partially through surface mount device pads, process block 830. Under certain embodiments, vias formed through surface mount device pads may be filled with a conductive or non-conductive material, process block 835. A surface mount device is mounted on the surface of the circuit board, process block 840, with one or more leads of the surface mount device being installed on the pads that include vias. Note that the embodiment shown in FIG. 8 is one example and that the placement of vias in any particular circuit board will vary depending on the unique requirements for the design of the board.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A circuit board comprising:

a first layer and a second layer;

a substrate between the first layer and the second layer;

a first surface mount device pad on the first layer of the substrate, the first surface mount device pad having a first end and a second end;

a first via, the first via being formed partially or wholly through the first end of the first surface mount device pad, the first via passing through the substrate between the first layer and the second layer;

a second surface mount device pad adjacent to the first surface mount device pad, the second surface mount device pad having a first end and a second end, the first end of the first surface mount device pad being adjacent to the first end of the second surface mount device pad and the second end of the first surface mount device pad being adjacent to the second end of the second surface mount device pad; and a second via, the second via being formed partially or wholly through the second end of the second surface mount device pad, the second via passing through the substrate.

2. The circuit board of claim 1, wherein the first via electrically connects the first surface mount device pad to one or more layers of the circuit board.

3. The circuit board of claim 2, wherein a signal is transmitted between the first surface mount device pad and one or more layers of the circuit board through the first via.

4. The circuit board of claim 1, further comprising a surface mount device installed on the first layer of the substrate, a first lead of the surface mount device being connected to the first surface mount device pad and a second lead of the surface mount device being connected to the second surface mount device pad.

5. A circuit board comprising:

a first layer and a second layer, the first layer including a first pad and a second pad for installation of an electronic component to the first layer, the first pad and the second pad being adjacent to each other, the first pad and the second pad each having a first end and a second end, the first end of the first pad being adjacent to the first end of the second pad and the second end of the first pad being adjacent to the second end of the second pad;

a first via in the first pad, the first via being formed in the first end of the first pad, the first via passing partially or wholly through the first pad and passing through the circuit board between the first layer and the second layer; and a second via in the second pad, the second via passing partially or wholly through the second pad, the second via being formed in the second end of the second pad.

6. The circuit board of claim 5, wherein the first via electrically connects the first pad to the second layer.

7. The circuit board of claim 6, wherein a signal is transmitted between the first pad and the second layer using the first via.

8. The circuit board of claim 5, further comprising an electronic component coupled to the first layer, the component including a first lead and a second lead, the first lead being coupled to the first pad and the second lead being coupled to the second pad.

9. A method comprising:

creating a first surface mount device contact and a second surface mount device contact as a part of a first layer of a circuit board, the first surface mount device contact and the second surface mount contact device being adjacent to each other, the first surface mount device contact and the second surface mount device contact each having a first end and a second end, the first end of the first surface mount device contact being adjacent to the first end of the second surface mount device contact, and the second end of the first surface mount device contact being adjacent to the second end of the second surface mount device contact;

forming a first via wholly or partially through the first surface mount device contact, the first via electrically connecting the first surface mount device contact to a second layer of the circuit board, the first via being formed in the first end of the first surface mount device contact; and forming a second via wholly or partially through the second surface mount contact device, the second via being formed in the second end of the second surface mount device contact.

10. The method of claim 9, further comprising installing a surface mount device on the first layer of the circuit board, a first lead of the surface mount device being connected to the first surface mount device contact and a second lead of the surface mount device being connected to the second surface mount device contact.

11. The method of claim 9, wherein the first via provides a path for a signal between the first layer and the second layer.

12. A circuit board produced by a process comprising:

creating a first surface mount device contact as a part of a first layer on a surface of a substrate, the first surface mount device contact having a first end and a second end;

forming a first via wholly or partially through the first end of the first surface mount device contact, the first via electrically connecting the first surface mount device contact to a second layer;

creating a second surface mount device contact as a part of the first layer, the second surface device contact being adjacent to the first surface mount device contact, the second surface mount device contact having a first end and a second end, the first end of the first surface mount device contact being adjacent to the first end of the second surface mount device contact and the second end of the first surface mount device contact being adjacent to the second end of the second surface mount device contact; and forming a second via wholly or partially through the second end of the second surface mount device contact.

13. The circuit board of claim 12, the process further comprising installing a surface mount device on the first layer, a first lead of the surface mount device being connected to the first surface mount device contact and a second lead of the surface mount device being connected to the second surface mount device contact.

14. The circuit board of claim 12, wherein the first via provides a path for a signal between the first layer and the second layer.

\* \* \* \* \*